United States Patent [19]

Jarrett et al.

[11] Patent Number: 5,101,179
[45] Date of Patent: Mar. 31, 1992

[54] Y-CONNECTED THREE PORT CIRCULATOR

[75] Inventors: Nathan Jarrett, East Lansing, Mich.; Barak Maoz, Newton, Mass.

[73] Assignee: Hittite Microwave Corporation, Woburn, Mass.

[21] Appl. No.: 612,902

[22] Filed: Nov. 14, 1990

[51] Int. Cl.⁵ .............................................. H01P 5/16
[52] U.S. Cl. .......................................... 333/1; 333/1.1
[58] Field of Search ...................... 333/1, 1.1, 100, 117, 333/118, 120, 124, 125, 127, 128

[56] References Cited

U.S. PATENT DOCUMENTS 3,860,893  1/1975  Ropars et al. ................... 333/1.1 X

FOREIGN PATENT DOCUMENTS 1263883  3/1968  Fed. Rep. of Germany ....... 333/1.1
2337072  11/1974 Fed. Rep. of Germany ....... 333/1.1
90713    3/1990  Japan ................................... 333/1.1

*Primary Examiner*—Paul Gensler
*Attorney, Agent, or Firm*—Iandiorio & Dingman

[57] ABSTRACT

A "Y" connected three port circulator is disclosed having three transmission mediums interconnected at a bias terminal to form a reciprocal "Y" connection having three distal terminals; a capacitor connecting the bias terminal to ground; and three non-reciprocal coupling circuits, one connected between each pair of distal terminals.

16 Claims, 2 Drawing Sheets

Y-CONNECTED THREE PORT CIRCULATOR

FIELD OF INVENTION

This invention relates to a three port circulator, and more particularly to a three port circulator which combines the transmission medium and bias circuit.

BACKGROUND OF INVENTION

With the improved three port circulators such as shown in U.S. Pat. No. 4,801,901, it is difficult to achieve optimized performance at the same frequency of all three parameters: insertion loss, isolation, and return loss. Insertion loss is the decrease in the signal level between the first input port, and the second, through port. All the signals from the input port should go to the second port and none should go to the third port. Such total separation is practically unobtainable; there are some losses between the first and second ports and some signals leak to the third port. The leakage to the third port is a measure of isolation. In such devices isolation is very good but it is not total. In addition ideally the incoming signal should be absorbed entirely and without reflection. But that is not practically achievable and this is measured as return loss.

The difficulty in maximizing performance of such devices is increased by the fact that each of those characteristics—insertion loss, reflection loss and isolation—tend to be optimized at a different frequency. Thus maximizing performance with respect to one reduces performance with respect to the other two. This non-symmetrical conduct with respect to the center frequency compels a compromise which results in less than optimal performance.

SUMMARY OF INVENTION

It is therefore an object of this invention to provide a three port circulator in which the insertion loss, isolation and return loss are all three optimized at the same frequency.

It is a further object of this invention to provide such a three port circulator in which the insertion loss, isolation and return loss are all optimized at the center frequency of the circulator.

It is a further object of this invention to provide such a three port circulator which is simpler in design, uses fewer components and has improved performance.

It is a further object of this invention to provide such a three port circulator which combines the bias circuit and transmission mediums to obtain improved performance with fewer components.

This invention results from the realization that a simpler yet more effective three port circulator can be achieved by employing the biasing networks to construct a "Y" connected, three port circulator which eliminates the connected impedances and uses fewer components, yet provides optimal insertion loss, isolation and return loss balanced about the center frequency of the circulator.

This invention features a "Y" connected three port circulator having three transmission mediums interconnected at a bias terminal to form a reciprocal "Y" connection having three distal terminals. A capacitor is connected from the bias terminal to ground. Three non-reciprocal coupling circuits are interconnected, one between each pair of the distal terminals.

In a preferred embodiment the non-reciprocal coupling circuits each may include a non-reciprocal amplifier in series with a coupling means. The coupling means may include a capacitor, and the coupling means may be interconnected between the distal terminal and the associated non-reciprocal amplifier. The non-reciprocal amplifier may include an FET with its gate electrode connected to a distal terminal, one of its load electrodes connected to an adjacent distal terminal and the other of its load electrodes connected to ground. Alternatively, the load electrodes may be connected through an impedance to a common port which in turn is connected to ground through an impedance. The circulator may also include an input coupling circuit in series with each of the distal terminals. The input coupling circuit may include a capacitor. Each of the non-reciprocal coupling circuits may include a matching circuit for shunting the non-reciprocal coupling circuit. The matching circuit may include a capacitor and the non-reciprocal amplifier may be an FET, and the matching capacitor may be a drain matching capacitor connected across the load electrodes of the FET. The transmission medium may be a transmission line section.

The invention also features a "Y" connected three port circulator having three transmission mediums interconnected at a bias terminal to form a reciprocal "Y" connection having three distal terminals, one associated with each transmission medium. A d.c. blocking capacitor is connected from bias terminal to ground. Three input terminals are provided, one associated with each of the distal terminals and transmission mediums. Three input coupling circuits are connected between each of the input terminals and the associated distal terminals. Three non-reciprocal coupling circuits are connected each between an input terminal of one transmission medium and a distal terminal of an adjacent transmission medium.

In a preferred embodiment, the transmission medium may be a transmission line section and the input coupling circuits may include a capacitor. The non-reciprocal coupling circuit may include a non-reciprocal amplifier in series with the coupling means, and the coupling means may be a capacitor.

DISCLOSURE OF PREFERRED EMBODIMENT

Other objects, features and advantages will occur to those skilled in the art from the following description of a preferred embodiment and the accompanying drawings, in which.

Figure 1:
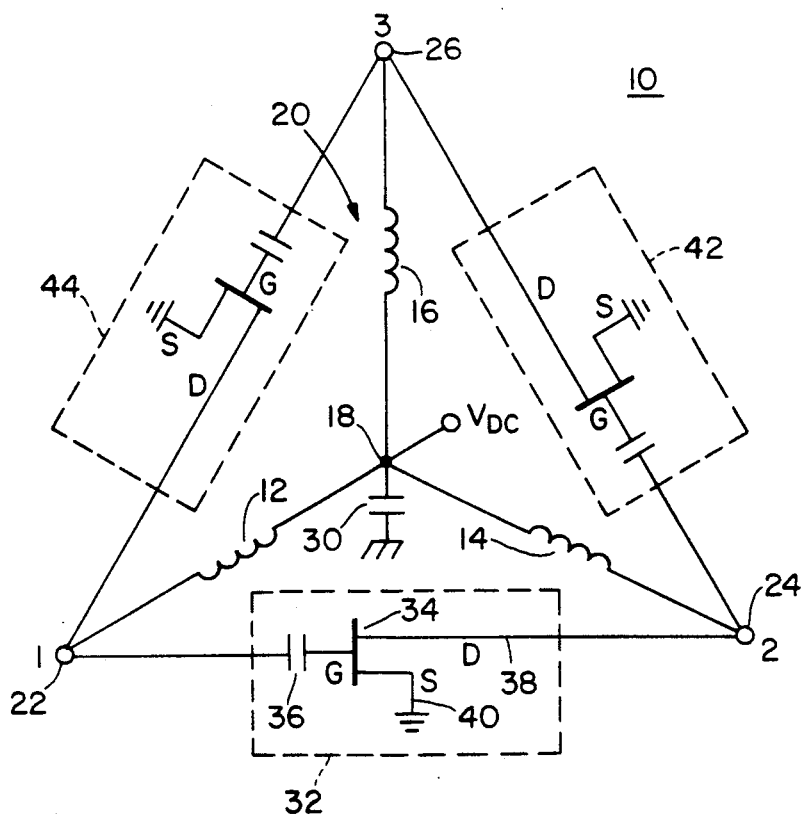
FIG. 1 is a schematic diagram of a "Y" connected three port circulator according to this invention.
Figure 2:
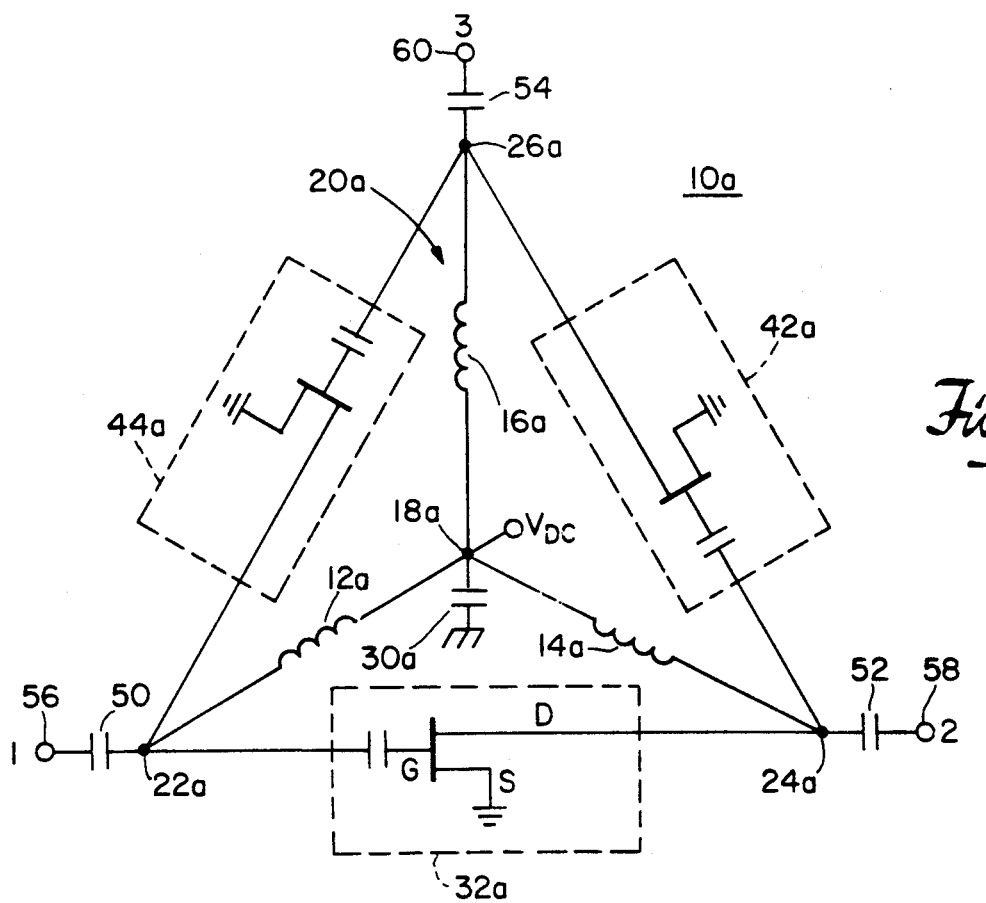
FIG. 2 is a view similar to FIG. 1 with the addition of input coupling circuits at each input port to more sharply tune the circulator so that all three characteristics, insertion loss, isolation and return loss, are optimized at the center frequency of the circulator.
Figure 3:
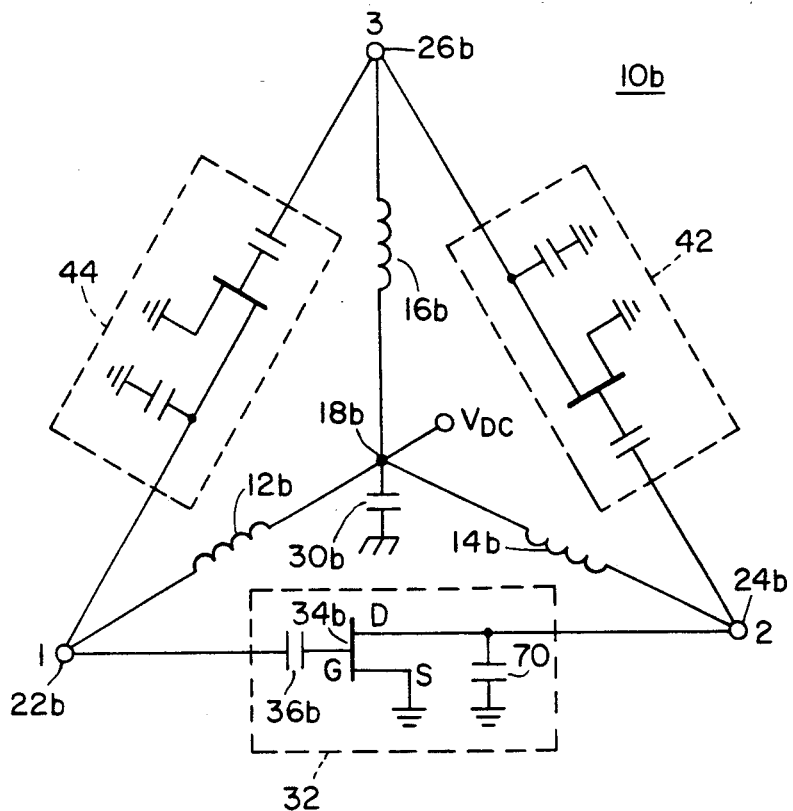
Figure 4:
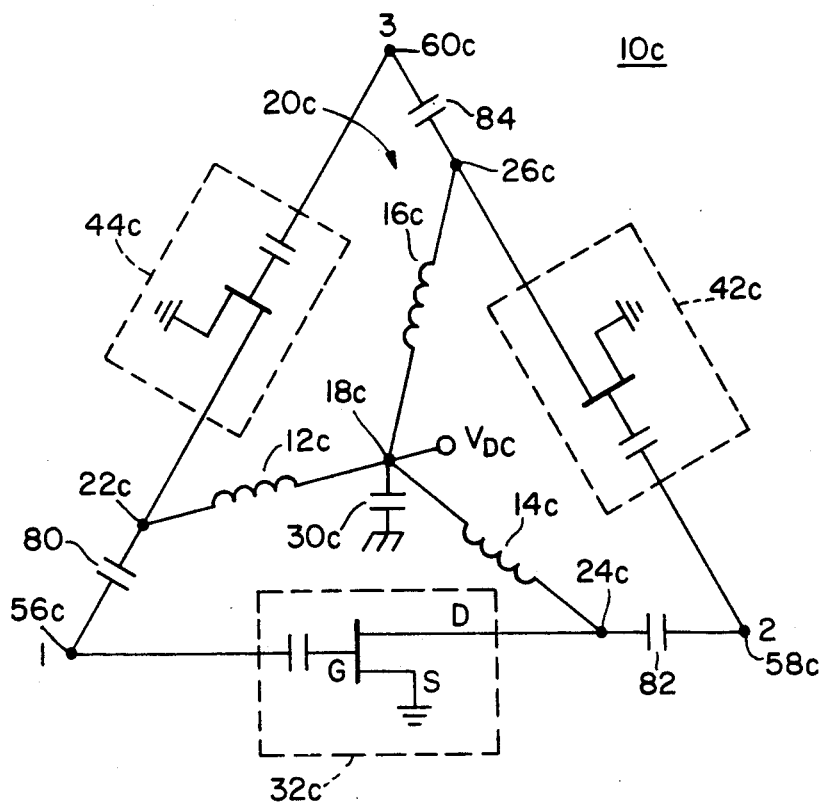

FIG. 3 is a view similar to FIGS. 1 and 2 with a matching circuit shunting the non-reciprocal coupling circuit to more sharply tune the circulator so that all three characteristics, insertion loss, isolation and return loss, are optimized at the center frequency of the circulator; and FIG. 4 is a view similar to FIGS. 1, 2 and 3 wherein the non-reciprocal coupling circuits are interconnected between an input terminal associated with one leg of the "Y" network and the distal terminal of an adjacent leg of the "Y" network.

The invention may be accomplished with a three port circulator in which the biasing circuits for each leg of a conventional connected three port circulator, for example, are folded or combined so that the inductance of the transmission line is combined with and functions both as a transmission medium and as part of the biasing circuit. The central terminal of the "Y" connected circulator becomes the d.c. biasing point where the d.c. voltage is applied. A capacitor is connected from the center of the "Y" to ground. This capacitor allows the characteristics (magnitude, phase) of the signal traversing the "Y" to be more optimally tuned such that this signal cancels signals arriving at the isolated port via other paths over a relatively broad frequency range. This capacitance, coupled with the combining of the transmission and biasing functions of the inductors, results in a convergence of the optimal operating frequency for isolation, return loss and insertion loss. A non-reciprocal coupling circuit is interconnected between each pair of distal terminals of the three "Y" connected transmission mediums. Each of tee non-reciprocal coupling circuits may include a non-reciprocal amplifier in series with a coupling means, for example a capacitor. Shunt coupling circuits may be applied across the load terminals of the non-reciprocal coupling circuit and/or may be placed in series with the distal terminals to provide enhanced tuning capability to adjust the input impedance of the circulator.

There is shown in FIG. 1 a three port circulator 10 including three transmission mediums or transmission line sections or impedances, as represented by inductances 12, 14 and 16 interconnected at central terminal 18 to form a "Y" connected network 20 having a distal terminal 22, 24, 26 associated with the free end of each inductance 12, 14 and 16. These terminals are also referred to as terminals 1, 2 and 3. Center terminal 18 is the d.c. bias point, where d.c. voltage $V_{dc}$ is applied. Capacitor 30 is also connected from terminal 18 to ground. Between each pair of distal terminals 22, 24; 24, 26; and 26, 22,. there is connected a non-reciprocal coupling circuit 32, 42, 44, as illustrated with respect to circuit 32, which includes an amplifier 34 connected in series with a coupling capacitor 36. Amplifier circuit 34 may be simply an FET with its drain 38 connected to one terminal and its source connected to ground. Its gate is connected to coupling circuit 36, which may simply be a capacitor as shown. A similar non-reciprocal coupling circuit 42 identical with circuit 32 is connected between distal terminal 24 and distal terminal 26, and the third identical, non-reciprocal coupling circuit 44 is interconnected between distal terminal 26 and distal terminal 22.

For a three port circulator such as circulator 10, the inductances 12, 14 and 16 would have a value of 1.2 nH. Capacitor 30 has a value of 2.0 pF and capacitor 36 along with its counterpart capacitors in non-reciprocal coupling circuit 42 and 44 typically have a value of 0.25 pF. The FETs may be standard 0.5×300 μm.

Circulator 10a, FIG. 2, also includes three inductors 12a, 14a and 16a connected in a "Y" configuration 20a with a center terminal 18a and three distal terminals 22a, 24a, 26a. d.c. bias voltage is applied to center terminal 18a, which also has connected across it an impedance in the form of capacitor 30a. As previously with FIG. 1, connected between each pair of distal terminals is a non-reciprocal coupling circuit 32a, 42a, and 44a. However, in FIG. 2 there is an additional component in the form of three input coupling circuits implemented by capacitors 50, 52 and 54 which are connected in series between each of the distal terminals 22a, 24a, 26a, respectively, and their associated input terminals 56, 58 and 60. These input coupling capacitors 50, 52 and 54 are used to adjust the circuit to improve the impedance matching for reducing return loss and typically have a value of 1.6 pF for circulator ports operating in the range of 5,000 MHz. The remaining components in FIG. 2 have values similar to those given for the corresponding components of FIG. 1.

Three port circulator 10b, FIG. 3, also provides enhanced tuning to adjust the input impedance of the circulator. Circulator 10b also includes inductances 12b, 14b and 16b connected in a "Y" configuration with three distal terminals 22b, 24b and 26b in a single central terminal 18b which is the d.c. bias point that is interconnected with capacitor 30b.

In circulator 10b, FIG. 3, each non-reciprocal coupling circuit 32, 42 and 44, in addition to having a coupling circuit which is capacitor 36b, and non-reciprocal amplifier circuit such as FET 34b, including a matching circuit 70 which may be a capacitor having a value of 0.3 pF. The remaining components in circulator 10b, FIG. 3, have values similar to those for circulators 10 and 10a in FIGS. 1 and 2, respectively.

In another construction, circulator 10c, FIG. 4, includes three inductors 12c, 14c, 16c, formed in a "Y" connection 20c with a central terminal 18c at its center and three distal terminals 22c, 24c and 26c. Again capacitor 30c is provided connected from terminal 18c to ground. Terminal 18c is again the d.c. bias point where the d.c. bias voltage $V_{dc}$ is applied. There are again three non-reciprocal coupling circuits 32c, 42c and 44c, but in this case the connection with the "Y" network 20c is slightly different. There are three input terminals 56c, 58c, 60c, each of which is interconnected with the associated distal terminal 22c, 24c, 26c, respectively, by means of an input coupling capacitor 80, 82 and 84. The non-reciprocal coupling circuits 32c, 42c, 44c, then are connected between an input terminal associated with one transmission medium and the distal terminal associated with the adjacent transmission medium. In FIG. 4, non-reciprocal coupling circuit 32c is interconnected between input terminal 56c and distal terminal 24c. Non-reciprocal coupling circuit 42c is connected between input terminal 58c and distal terminal 26c. Non-reciprocal coupling circuit 44c is interconnected between input terminal 60c and distal terminal 22c. Input coupling circuits 80, 82 and 84 are shown implemented as capacitors, which may have a value of 1 pF. and function to match the impedance of the drain electrode on its associated FET. The other elements of circulator 10c have values similar to those used in FIGS. 1, 2 and 3.

In a broader implementation, a three port circulator includes three transmission mediums or transmission line sections or impedances such as inductances interconnected at a center terminal to form a "Y" connected network having three distal terminals, associated with the free end of each inductance. The center terminal 18 is connected to ground through a capacitor. Between each pair of distal terminals, there is connected a non-reciprocal coupling circuit, that includes an amplifier in series with a coupling capacitor. The amplifier circuit is an FET with its drain connected to one terminal and its source connected through an impedance to a common point or node. The common point is connected to ground through a second impedance. The impedances may be inductors (capacitors) with a value of 0.1-10 nH (0.1-10 Pf).

Although specific features of the invention are shown in some drawings and not others, this is for convenience only as each feature may be combined with any or all of the other features in accordance with the invention.

Other embodiments will occur to those skilled in the art and are within the following claims:

What is claimed is:

1. A "Y" connected three port non-ferrite circulator comprising:
   three transmission mediums interconnected at a bias terminal to form a reciprocal "Y" connection having three distal input terminals, one associated with each transmission medium;
   a capacitor connected from said bias terminal to ground; and
   three-delta-connected non-reciprocal coupling circuits, each one interconnected between a pair of said distal input terminals, said bias terminal being operable to apply a biasing signal to said non-reciprocal coupling circuit.

2. The three port circulator of claim 1 in which each said non-reciprocal coupling circuit includes a non-reciprocal amplifier in series with a coupling means.

3. The three port circulator of claim 2 in which said coupling means includes a capacitor.

4. The three port circulator of claim 2 in which each said coupling means is interconnected between a said distal terminal and a said non-reciprocal amplifier.

5. The three port circulator of claim 2 in which each said non-reciprocal amplifier includes an FET with its gate electrode connected to a said distal terminal, one of its load electrodes connected to an adjacent said distal terminal, and the other of its load electrodes connected to ground.

6. The three port circulator of claim 1 further including an input coupling circuit in series with each of said distal terminals.

7. The three port circulator of claim 6 in which each said input coupling circuit includes a capacitor.

8. The three port circulator of claim 1 in which each of said non-reciprocal coupling circuits includes a matching circuit shunting said non-reciprocal coupling circuit.

9. The three port circulator of claim 8 in which each said matching circuit includes a matching capacitor.

10. The three port circulator of claim 8 in which each said non-reciprocal amplifier includes an FET and each said matching capacitor is a drain matching capacitor connected across the load electrodes.

11. The three port circulator of claim 1 in which said transmission mediums are transmission line sections.

12. A "Y" connected three port circulator comprising:
   three transmission mediums interconnected at a bias terminal to form a reciprocal "Y" connection having three distal terminals, one associated with each transmission medium;
   a capacitor connected from said bias terminal to ground;
   three input terminals, one associated with each of said terminals and transmission mediums;
   three input coupling circuits one connected between each of said input terminals and the associated distal terminal; and
   three non-reciprocal coupling circuits, each one interconnected between a said input terminal of one transmission medium and a said distal terminal of an adjacent said transmission medium.

13. The three port circulator of claim 12 in which said transmission mediums are transmission line sections.

14. The three port circulator of claim 12 in which said input coupling circuits are capacitors.

15. The three port circulator of claim 12 in which said non-reciprocal coupling circuit includes a non-reciprocal amplifier in series with a coupling means.

16. The three port circulator of claim 15 in which said coupling means is a capacitor.

* * * * *